US009495510B2

(12) United States Patent
Takita et al.

(10) Patent No.: US 9,495,510 B2
(45) Date of Patent: Nov. 15, 2016

(54) RECORDING MEDIUM, ACCOMMODATION DESIGN DEVICE, AND ACCOMMODATION DESIGN METHOD

(71) Applicant: FUJITSU LIMITED, Kawasaki-shi (JP)

(72) Inventors: Yutaka Takita, Kawasaki (JP);
Kazuyuki Tajima, Yokosuka (JP);
Tomohiro Hashiguchi, Inagi (JP)

(73) Assignee: FUJITSU LIMITED, Kawasaki (JP)

(*) Notice: Subject to any disclaimer, the term of this patent is extended or adjusted under 35 U.S.C. 154(b) by 730 days.

(21) Appl. No.: 13/859,127

(22) Filed: Apr. 9, 2013

(65) Prior Publication Data

US 2013/0311150 A1 Nov. 21, 2013

(30) Foreign Application Priority Data

May 21, 2012 (JP) ................................. 2012-115939

(51) Int. Cl.
| G06F 17/50 | (2006.01) |
| G06F 7/60 | (2006.01) |
| G06F 17/10 | (2006.01) |
| H04Q 11/00 | (2006.01) |

(52) U.S. Cl.
CPC ......... *G06F 17/509* (2013.01); *H04Q 11/0003* (2013.01)

(58) Field of Classification Search
CPC .................... G06F 17/509; H04Q 11/0003
USPC ....................................................... 703/1, 2
See application file for complete search history.

(56) References Cited

U.S. PATENT DOCUMENTS

| 6,404,744 B1 * | 6/2002 | Saito | H04L 41/142 |
| | | | 370/255 |
| 8,687,959 B2 * | 4/2014 | Muppidi | H04B 10/0773 |
| | | | 398/30 |

FOREIGN PATENT DOCUMENTS

JP 11-008641 1/1999

* cited by examiner

*Primary Examiner* — Aniss Chad
(74) *Attorney, Agent, or Firm* — Fujitsu Patent Center

(57) ABSTRACT

A CPU collects count information of NW-side/CL-side communication cards when IFCs with plural types that store NW-side/CL-side communication cards to be designed are accommodated in two or more shelves. The CPU further collects card information of the number of slots used by IFCs, shelf information of the maximum number of slots that can be accommodated by IFCs in the shelf, and correspondence information of correspondence relationship when between-shelf-intercommunication between different NW-side communication cards is performed. The CPU further collects communication limit capacity to be used for intercommunication between the shelves. The CPU generates an integer planning model for assigning IFCs to be designed into two or more minimum shelves on the basis of card information, count information, shelf information, correspondence information, and communication limit capacity. The CPU executes the integer planning model and outputs a design solution for accommodation design for assigning IFCs into the minimum shelves.

8 Claims, 16 Drawing Sheets

FIG.8A

| NAME | TYPE | DESCRIPTION |
|---|---|---|
| h | (Object) | NW-SIDE OPTICAL PATH |
| H100 | (set of h) | SET OF OPTICAL PATHS h OF BAND 100G |
| H10 | (set of h) | SET OF OPTICAL PATHS h OF BAND 10G |
| s | (Object) | SHELF HAVING SWF (HEREINAFTER, SIMPLY "SHELF") |
| OP (h, s) | 0/1 Integer Var. | IDENTIFIER INDICATING WHETHER OPTICAL PATH h IS USED IN SHELF s<br>1: USED, 0: NOT USED |
| NW_10G_IFC (s) | Integer Var. | NUMBER OF IFCS STORING NW-SIDE COMMUNICATION CARDS OF 10G IN SHELF s |
| CL_10G_IFC (s) | Integer Var. | NUMBER OF IFCS STORING CL-SIDE COMMUNICATION CARDS OF 10G IN SHELF s |
| CL_1_2.5G_IFC (s) | Integer Var. | NUMBER OF IFCS STORING CL-SIDE COMMUNICATION CARDS OF 1.25G/2.5G IN SHELF s |
| transferFlag (s1, s2, h1, h2) | 0/1 Integer Var. | IDENTIFIER INDICATING WHETHER OPTICAL PATHS h1 AND h2 ARE SEPARATED INTO AND ACCOMMODATED IN SHELVES s1 AND s2<br>0: SEPARATED INTO AND ACCOMMODATED IN s1 AND s2<br>1: NOT SEPARATED INTO AND ACCOMMODATED IN s1 AND s2 |
| NorthRoundFlag (s1, s2, h1, h2) | 0/1 Integer Var. | IDENTIFIER INDICATING FROM WHICH OF ROTATION DIRECTIONS INTERCOMMUNICATION BETWEEN SHELVES IS PERFORMED WHEN OPTICAL PATHS h1 AND h2 ARE SEPARATED INTO AND ACCOMMODATED IN SHELVES s1 AND s2<br>0: WHEN IT IS NORTH-ROUND<br>1: WHEN IT IS NOT NORTH-ROUND (IT IS SOUTH-ROUND) |
| SouthRoundFlag (h1, h2, s1, s2) | 0/1 Integer Var. | IDENTIFIER INDICATING FROM WHICH OF ROTATION DIRECTIONS INTERCOMMUNICATION BETWEEN SHELVES IS PERFORMED WHEN OPTICAL PATHS h1 AND h2 ARE SEPARATED INTO AND ACCOMMODATED IN SHELVES s1 AND s2<br>0: WHEN IT IS SOUTH-ROUND<br>1: WHEN IT IS NOT SOUTH-ROUND (IT IS NORTH-ROUND)<br>∗ IDENTIFIER IS 0 CERTAINLY WHEN INTERCONNECTION BETWEEN SHELVES IS SERIES. |
| Slot_100G_NW_IFC | Const. | NUMBER OF SLOTS OF 100G OPTICAL PATH (NW-SIDE COMMUNICATION CARDS) (FOUR, IN EMBODIMENT) [COMMUNICATION CARDS OF 100G CAN BE DIRECTLY ACCOMMODATED] |
| Slot_10G_NW_IFC | Const. | NUMBER OF SLOTS OF IFC STORING NW-SIDE COMMUNICATION CARDS OF 10G (TWO, IN EMBODIMENT) |
| Slot_10G_CL_IFC | Const. | NUMBER OF SLOTS OF IFC STORING CL-SIDE COMMUNICATION CARDS OF 10G (TWO, IN EMBODIMENT) |
| Slot_1_2.5_CL_IFC | Const. | NUMBER OF SLOTS OF IFC STORING CL-SIDE COMMUNICATION CARDS OF 1.25G/2.5G OTHER THAN 10G (TWO, IN EMBODIMENT) |

FIG.8B

| NAME | TYPE | DESCRIPTION |
|---|---|---|
| ShelfSlotCap | Const. | NUMBER OF SLOTS THAT CAN BE USED PER ONE SHELF (24, IN EMBODIMENT) |
| RsvdSlotForIC (s) | Const. | NUMBER OF SLOTS OF IFC USED FOR INTERCOMMUNICATION BETWEEN SHELVES PER ONE SHELF |
| OP_BW (h) | Const. | BAND OF OPTICAL PATH h (8 FOR 10G OR 80 FOR 100G, IN EMBODIMENT) |
| 1_2.5GAddDndNum (h) | Const. | SUM OF DEMAND NUMBERS OF 1G AND 2.5G, ADDED FROM CURRENT NODE, BELONGING TO OPTICAL PATH h100 OR h10 |
| 10GAddDndNum (h) | Const. | SUM OF DEMAND NUMBERS OF 10G, ADDED FROM CURRENT NODE, BELONG TO OPTICAL PATH h100 OR h10 |
| Limit_10G_NW_IFC | Const. | MAXIMUM NUMBER OF NW-SIDE COMMUNICATION CARDS OF 10G THAT CAN BE STORED IN IFC FOR NW-SIDE COMMUNICATION CARD OF 10G (FIVE, IN EMBODIMENT) |
| Limit_1_2.5G_CL_IFC | Const. | MAXIMUM NUMBER OF CL-SIDE COMMUNICATION CARDS OF 1.25G AND 2.5G OTHER THAN 10G THAT CAN BE STORED IN IFC FOR CL-SIDE COMMUNICATION CARD OF 1.25G AND 2.5G OTHER THAN 10G (40, IN EMBODIMENT) |
| Limit_10G_CL_IFC | Const. | MAXIMUM NUMBER OF NW-SIDE COMMUNICATION CARDS OF 10G THAT CAN BE STORED IN IFC FOR CL-SIDE COMMUNICATION CARD OF 10G (10, IN EMBODIMENT) |
| tansferBW (h1, h2) | Const. | DEMAND CAPACITY BY WHICH TRANSFER BETWEEN OPTICAL PATHS h1 AND h2 IS PERFORMED |
| ConnectBWLimit (s1, s2) | Const. | LIMIT VALUE OF COMMUNICATION CAPACITY THAT IS SECURED BETWEEN SHELVES s1 AND s2 |
| NRContainSpan (ss1, ss2, s1, s2) | Const. (0 or 1) | IDENTIFIER INDICATING WHETHER INFORMATION PASSES BETWEEN SHELVES ss1 AND ss2 WHEN SENDING IT FROM SHELF s1 TO SHELF s2 IN NORTH-BOUND MANNER |
| SRContainSpan (ss1, ss2, s1, s2) | Const. (0 or 1) | IDENTIFIER INDICATING WHETHER INFORMATION PASSES BETWEEN SHELVES ss1 AND ss2 WHEN SENDING IT FROM SHELF s1 TO SHELF s2 IN SOUTH-BOUND MANNER |

| OPTICAL PATH NUMBER | SIGNAL BAND | FROM CLIENT | | | INTER OPTICAL PATH |
|---|---|---|---|---|---|
| | | 1.25G | 2.5G | 10G | 1.25G |
| 1 | 10G | 1 | 1 | 0 | 5 |
| 2 | 10G | 2 | 2 | 0 | 2 |
| 3 | 100G | 0 | 0 | 4 | 40 |
| 4 | 10G | 3 | 1 | 0 | 3 |
| 5 | 10G | 2 | 1 | 0 | 4 |
| 6 | 100G | 23 | 6 | 2 | 29 |
| 7 | 10G | 0 | 0 | 1 | 0 |
| 8 | 100G | 22 | 1 | 5 | 16 |
| 9 | 10G | 1 | 2 | 0 | 2 |
| 10 | 10G | 0 | 0 | 1 | 0 |
| 11 | 100G | 12 | 8 | 2 | 23 |
| 12 | 100G | 5 | 4 | 1 | 54 |
| 13 | 100G | 9 | 0 | 1 | 52 |
| 14 | 10G | 8 | 0 | 0 | 0 |
| 15 | 100G | 30 | 3 | 2 | 28 |

FIG.10

OPTICAL PATH NUMBER

|   | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 1 |   | - | - | 2 | 3 | - | - | - | - | -  | -  | -  | -  | -  | -  |
| 2 |   |   | - | - | - | - | - | 1 | - | -  | -  | -  | -  | -  | -  |
| 3 |   |   |   | - | - | - | - | 16| - | -  | -  | 24 | -  | -  | -  |
| 4 |   |   |   |   | 1 | - | - | - | - | -  | -  | -  | -  | -  | -  |
| 5 |   |   |   |   |   | - | - | - | - | -  | -  | -  | -  | -  | -  |
| 6 |   |   |   |   |   |   | - | - | - | -  | 23 | 6  | -  | -  | -  |
| 7 |   |   |   |   |   |   |   | - | - | -  | -  | -  | -  | -  | -  |
| 8 |   |   |   |   |   |   |   |   | - | -  | -  | -  | -  | -  | -  |
| 9 |   |   |   |   |   |   |   |   |   | -  | -  | -  | -  | -  | -  |
| 10|   |   |   |   |   |   |   |   |   |    | -  | -  | -  | -  | -  |
| 11|   |   |   |   |   |   |   |   |   |    |    | -  | -  | -  | -  |
| 12|   |   |   |   |   |   |   |   |   |    |    |    | 24 | -  | -  |
| 13|   |   |   |   |   |   |   |   |   |    |    |    |    | -  | 28 |
| 14|   |   |   |   |   |   |   |   |   |    |    |    |    |    | -  |
| 15|   |   |   |   |   |   |   |   |   |    |    |    |    |    |    |

OPTICAL PATH NUMBER

40

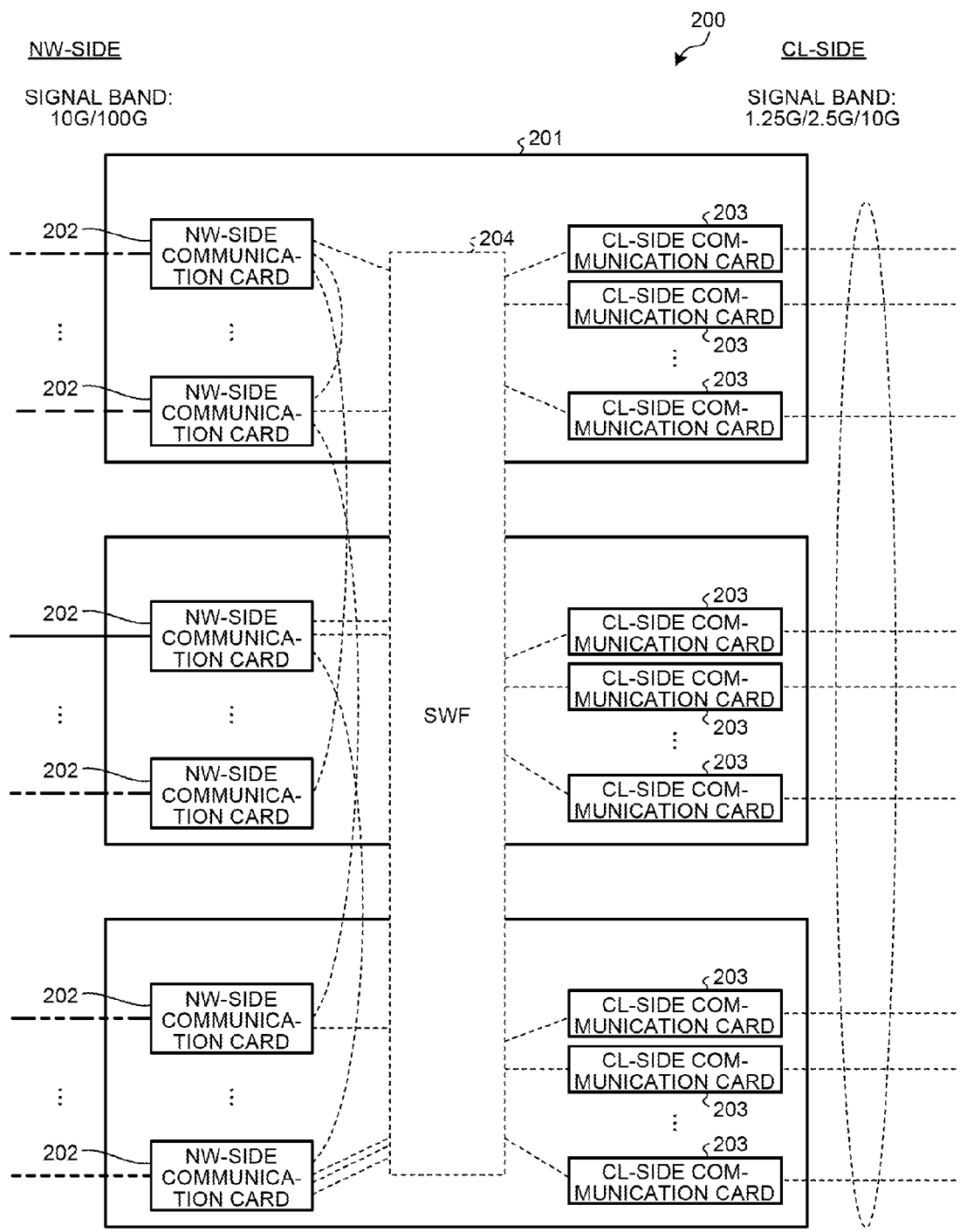

RECORDING MEDIUM, ACCOMMODATION DESIGN DEVICE, AND ACCOMMODATION DESIGN METHOD

CROSS-REFERENCE TO RELATED APPLICATION

This application is based upon and claims the benefit of priority of the prior Japanese Patent Application No. 2012-115939, filed on May 21, 2012, the entire contents of which are incorporated herein by reference.

FIELD

The embodiment discussed herein is related to an recording medium, an accommodation design device, and an accommodation design method.

BACKGROUND

In case of design of an optical network, the number of optical paths, used bands, channels of optical fibers, and the like that are accommodated in a network (NW) are designed by an optical path accommodation design technique. In this case, the number of optical paths, used bands, channels of optical fibers, and the like are designed every "node", and then accommodation design on how communication equipment is positioned is performed. Herein, in the case of OTN (Optical Transfer Network) accommodation design, for example, an optical path is a path of HO-ODU (Higher-Order Optical channel Data Unit).

FIG. 13 is an explanation diagram illustrating an example of a node that includes shelves whose hardware capacity is unlimited. A hardware capacity is a quantity of hardware and a volume of a case that are accommodated in shelves, for example. A node 200 illustrated in FIG. 13 includes shelves 201. The shelf 201 includes network-side (NW-side) communication cards 202 such as optical transmitters/receivers, client-side (CL-side) communication cards 203 such as electrical transmitters/receivers, and a switch fabric (SWF) 204. The NW-side communication card 202 is connected to an optical path with a signal band of 10 Gbps or 100 Gbps (bits per second). For convenience of explanation, "Gbps" is simply referred to as "G". The CL-side communication card 203 is connected to an electrical path with a signal band of 1.25G, 2.5G, or 10G. When the hardware capacity of the shelf 201 is unlimited, all the NW-side communication cards 202 and CL-side communication cards 203 can be accommodated in the one shelf 201. Therefore, accommodation design is not requested.

However, because the hardware capacity of the shelf 201 is actually limited, it is preferable that accommodation design is performed while considering all conditions such as the number of the shelves 201, the maximum volume of the shelf 201, a communication capacity between the shelves 201. Therefore, it is important to employ multi-shelf accommodation design in which the node 200 includes the shelves 201 whose hardware capacity is limited and the NW-side communication cards 202 and the CL-side communication cards 203 are accommodated in the shelf 201.

Because the shelf 201 is placed in a rack, it is desirable that the number of racks is one considering an occupied floor area of the rack. However, because it is actually required that the number of the shelves 201 is plural, it is required that the number of racks is plural considering the maximum number of shelves that can be accommodated in a rack.

In other words, multi-shelf accommodation design may be design on how the NW-side communication cards 202 and the CL-side communication cards 203 are accommodate in the shelf 201. It is noted that the NW-side communication cards 202 and the CL-side communication cards 203 are not directly stored in the shelf 201 but are accommodated in interface cards (IFC). The IFCs are accommodated in the shelf 201. Moreover, intercommunication between shelves occurs when the change (hereinafter, "transfer") of connection between optical paths of Demand in NW, namely, transferring between the NW-side communication cards 202 is performed. Therefore, intercommunication between shelves requires IFC for shelf intercommunication.

Therefore, it is considered that multi-shelf accommodation design employs a greedy method that is used to solve a "box packing" problem for efficiently accommodating the NW-side communication cards 202 and the CL-side communication cards 203 in the shelf 201. A greedy method is a method for packing elements (IFC) having a large size until they are fully packed in a box (shelf), and adding a new box (shelf) at the time when elements are not packed any more, and again packing the elements in the new box (shelf).

Patent Literature 1: Japanese Laid-open Patent Publication No. H11-008641

However, because a design result is influenced by an order by which elements are packed even if multi-shelf accommodation design is performed by using a greedy method, it is difficult to be said that the number of shelves can be suppressed to the minimum.

SUMMARY

According to an aspect of the embodiments, a computer-readable recording medium has stored therein an accommodation design program that causes a computer to execute a process including: collecting, when storage cards with plural types that store first communication cards and second communication cards are accommodated in two or more shelves, count information indicating a number of the first communication cards and the second communication cards, card information indicating a number of slots used by the storage cards, shelf information indicating a maximum number of slots to be accommodated by the storage cards in the shelf, correspondence information indicating a correspondence relationship when between-shelf-intercommunication between the different first communication cards is performed, and communication limit capacity capable of being used for the intercommunication between the shelves; generating an integer planning model for assigning the storage cards storing the first communication cards and the second communication cards to be designed into the two or more minimum shelves, on the basis of the card information, the count information, the shelf information, the correspondence information, and the communication limit capacity; and executing the integer planning model and outputting, when there is a design solution for accommodation design for assigning the storage cards into the minimum shelves, the design solution.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 8A and 8B are explanation diagrams illustrating an example of variables and constrained conditions of an integer planning model;

FIG. 10 is an explanation diagram illustrating an example of a second table;

FIG. 13 is an explanation diagram illustrating an example of a node that includes shelves whose hardware capacity is unlimited.

DESCRIPTION OF EMBODIMENT

Preferred embodiments of the present invention will be explained with reference to accompanying drawings. The present invention is not limited to the embodiment explained below.

Figure 1:
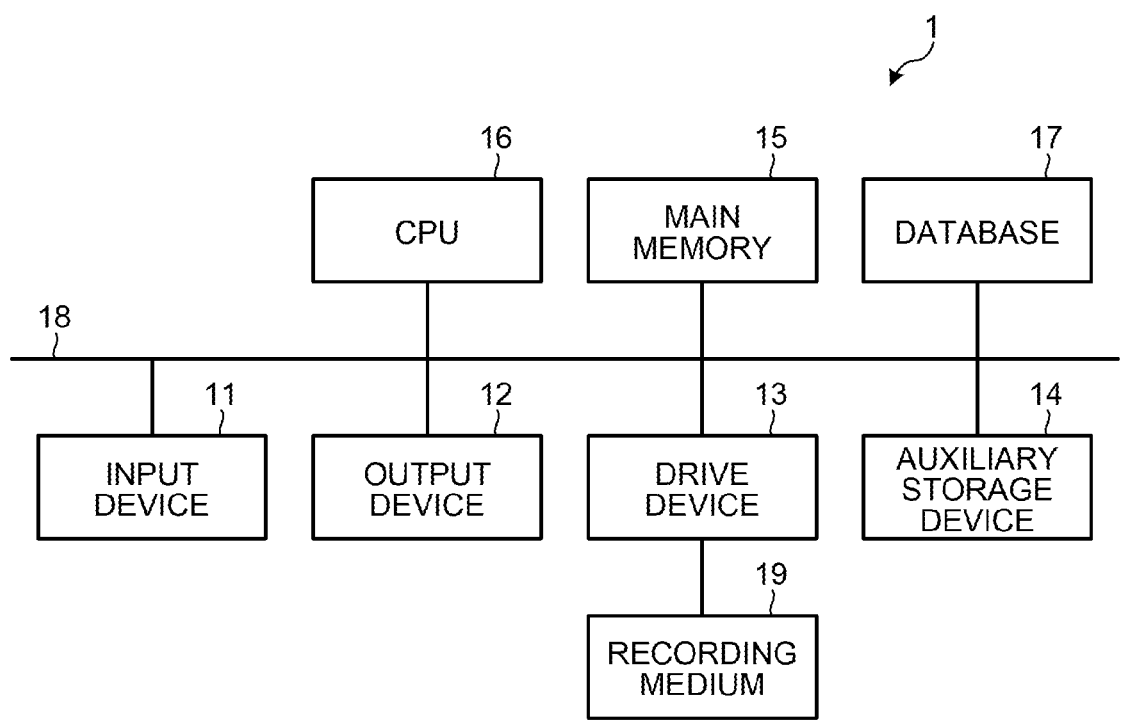
FIG. 1 is an explanation diagram illustrating an example of an accommodation design device according to an embodiment.

FIG. 1 is an explanation diagram illustrating an example of an accommodation design device 1 according to the present embodiment. The accommodation design device 1 illustrated in FIG. 1 realizes multi-shelf accommodation design in which IFCs that store NW-side communication cards and CL-side communication cards for design can be efficiently accommodated in two or more shelves. As an example, the accommodation design device 1 is constituted by a personal computer or a workstation.

The accommodation design device 1 includes an input device 11, an output device 12, a drive device 13, an auxiliary storage device 14, a main memory 15, a central processing unit (CPU) 16, and a database 17. These components are interconnected by a system bus 18. The input device 11 includes a keyboard and a mouse handled by a user and receives various data. The output device 12 includes a display that displays data such as various windows and design results required to operate a program for multi-shelf accommodation design. The output device 12 displays data such as various windows and design results on the display on the basis of an operation of an execution program. The execution program is recorded and provided in a recording medium 19 such as disk media and flash memory that records information by using light or magnetism, for example. The recording medium 19 in which a program is recorded is mounted on the drive device 13. The drive device 13 reads out the execution program stored in the recording medium 19 and loads the read execution program on the main memory 15. Moreover, the CPU 16 totally controls the accommodation design device 1. The CPU 16 performs various types of arithmetic processing on the basis of the execution program loaded on the main memory 15.

Figure 2:
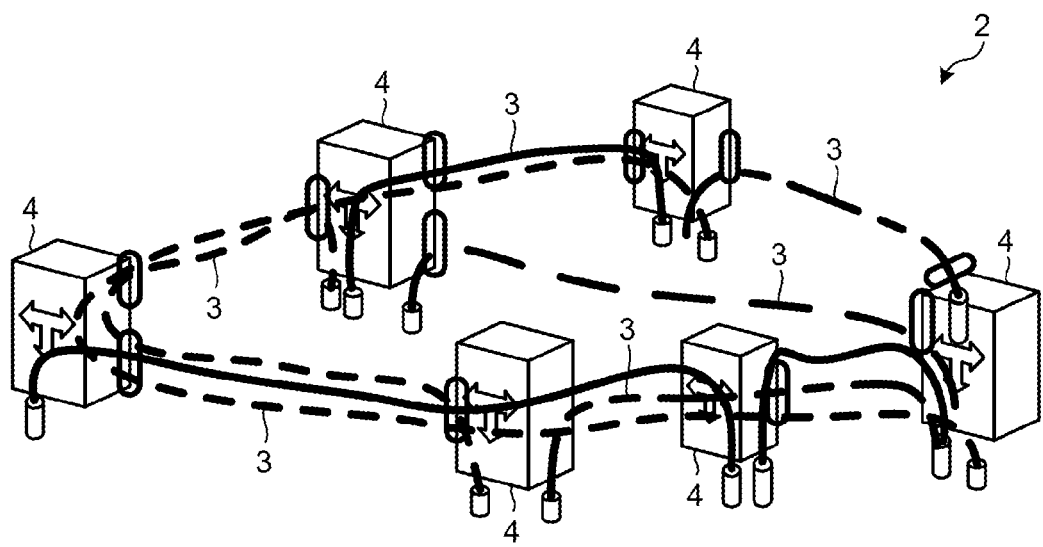
FIG. 2 is an explanation diagram illustrating an example of an optical network.

FIG. 2 is an explanation diagram illustrating an example of an optical network 2. The optical network 2 illustrated in FIG. 2 includes nodes 4 that correspond to optical add-drop multiplexers (OADM) that drop and add optical signals on optical paths 3 in units of light wavelength. Each of the nodes 4 is placed in a rack on which shelves 5 to be described later are mounted. In the multi-shelf accommodation design according to the present embodiment, because IFCs 6 for design are efficiently accommodated in the two or more shelves 5, the number of the shelves 5 in the node 4 is minimized.

Figure 3:
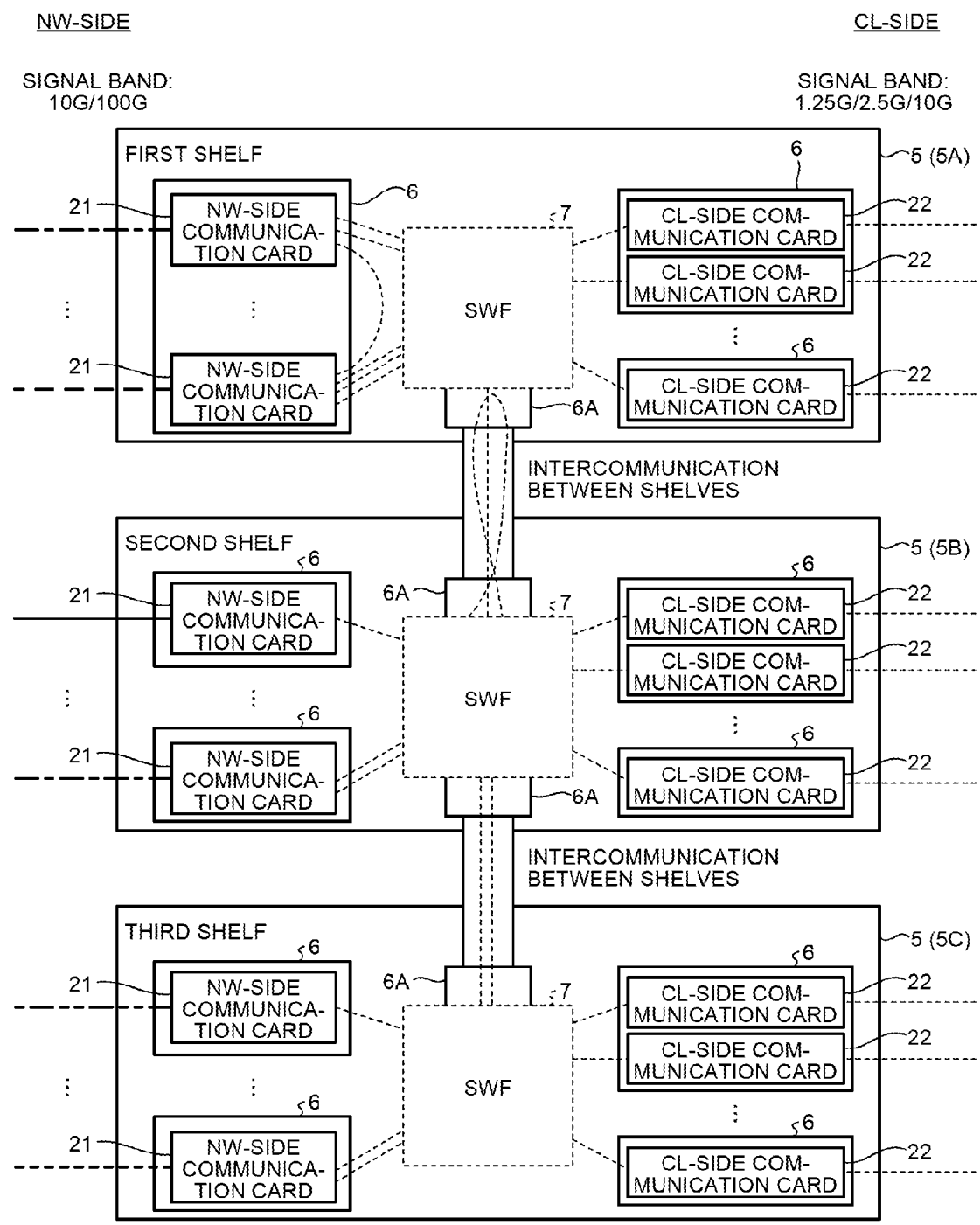
FIG. 3 is an explanation diagram illustrating an example of a node.

FIG. 3 is an explanation diagram illustrating an example of the node 4. Each of the shelves 5 in the node 4 mounts thereon communication cards that interconvert between optical signals on the optical path 3 with signal bands of 10G/100G and electrical signals on an electrical path with signal bands of 1.25G/2.5G/10G, for example. Moreover, the shelves 5 includes, for example, a first shelf 5A, a second shelf 5B, and a third shelf 5C. The shelf 5 includes the IFCs 6 and SWF 7. For example, the IFCs 6, which act as an example of a storage card, store NW-side communication cards 21 that act as an example of a first communication card and CL-side communication cards 22 that act as an example of a second communication card. Moreover, intercommunication between the shelves 5 is, for example, communication between the first shelf 5A and the second shelf 5B. Herein, intercommunication between the shelves 5 performs communication connection by using IFC 6A for intercommunication between shelves. Moreover, each of the CL-side communication cards 22 is connected to the NW-side communication card 21 that is designated previously. These CL-side communication card 22 and NW-side communication card 21 are accommodated in the same shelf 5. Therefore, the accommodation design device 1 manages, on a per-group basis, correspondence information that is obtained by associating the CL-side communication card 22 with the NW-side communication card 21 that communicates with the CL-side communication card 22.

Figure 4:
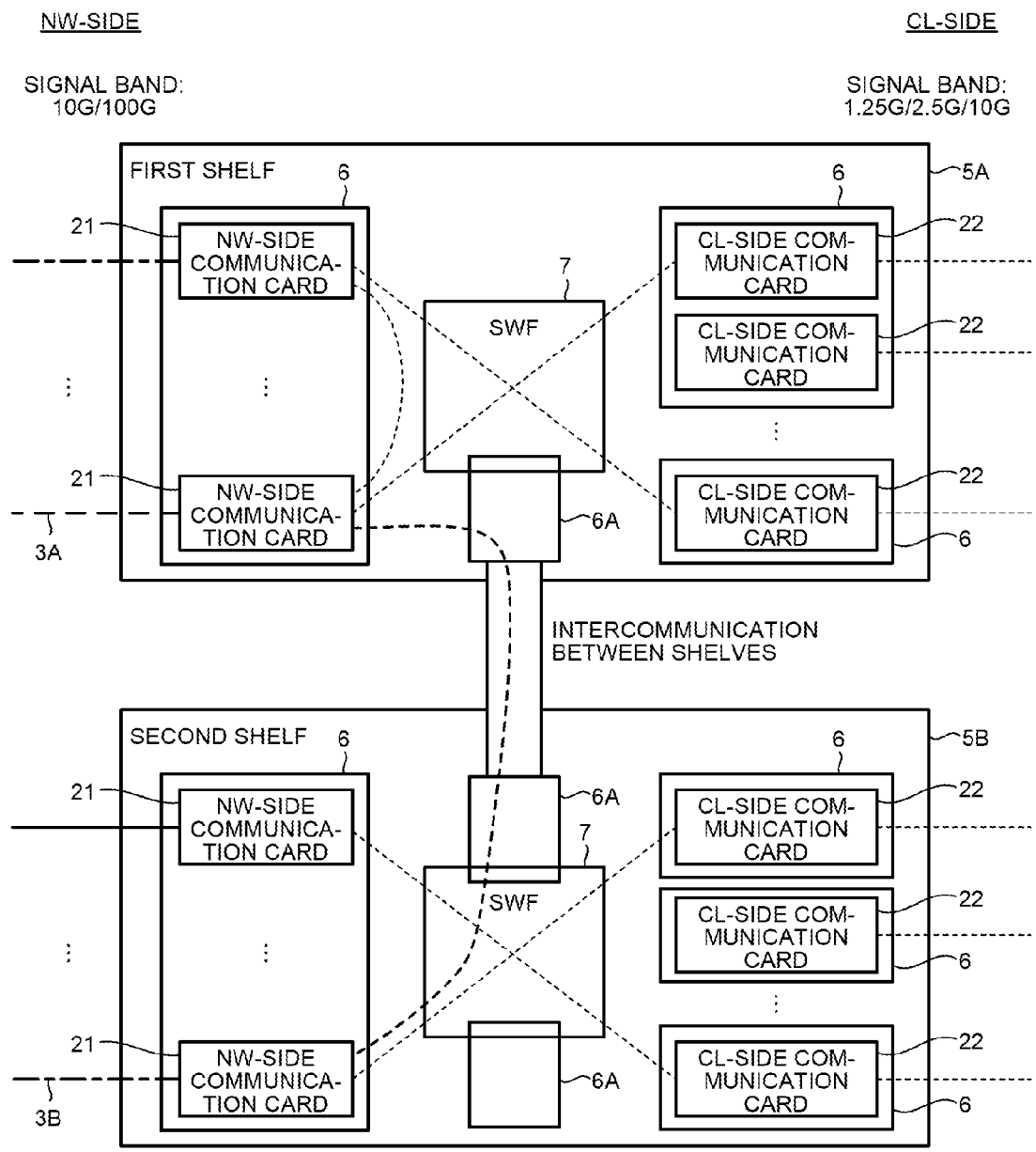
FIG. 4 is an explanation diagram illustrating an example of intercommunication between shelves.

FIG. 4 is an explanation diagram illustrating an example of intercommunication between the shelves 5. The IFC 6 of the NW-side communication card 21 in the first shelf 5A illustrated in FIG. 4 receives Demand through a first optical path 3A in NW and transmits it to the IFC 6A for intercommunication between shelves through the SWF 7. Furthermore, the IFC 6A for intercommunication between shelves in the first shelf 5A transmits the received Demand to the second shelf 5B through the SWF 7. The IFC 6A for intercommunication between shelves in the second shelf 5B receives Demand in NW from the first shelf 5A and transmits it to the IFC 6 of the NW-side communication card 21 through the SWF 7. Then, the IFC 6 of the NW-side communication card 21 in the second shelf 5B transmits Demand received from the first shelf 5A to a second optical path 3B in NW. In other words, when transfer between the optical paths 3 for transmitting Demand received via the first optical path 3A in NW onto the second optical path 3B is performed, intercommunication between the shelves 5 occurs.

Figure 5A:
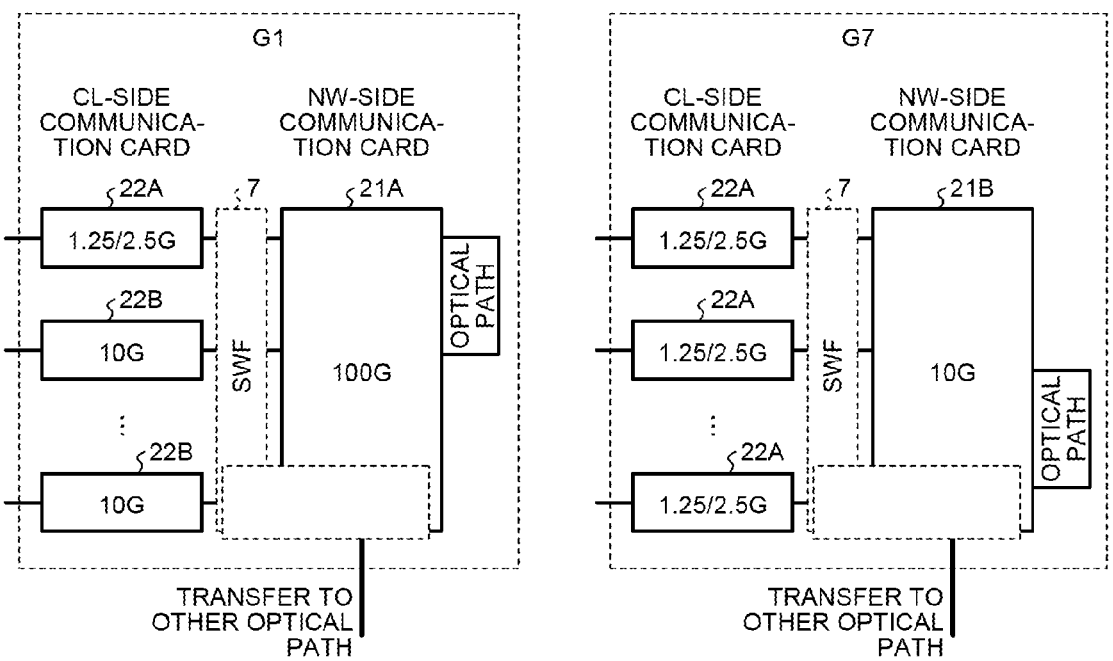
FIG. 5A is an explanation diagram illustrating an example of a group definition.

FIG. 5A is an explanation diagram illustrating an example of a group definition. The CL-side communication card 22 illustrated in FIG. 5A is grouped with the NW-side communication card 21 in accordance with its combination because the designated NW-side communication card 21 is previously set in case of communication connection. For example, a CL-side communication card 22A of 1.25G/2.5G and a CL-side communication cards 22B of 10G are connected to the designated NW-side communication card 21A of 100G in case of communication connection. Therefore, the CL-side communication card 22A, the CL-side communication cards 22B, and the NW-side communication card 21A are within the same group G1. Moreover, for example, the CL-side communication cards 22A of 1.25G/2.5G are connected to the designated NW-side communication card 21B of 10G in case of communication connection. Therefore, the CL-side communication cards 22A and the NW-side communication card 21B are within the same group G7.

Figure 5B:
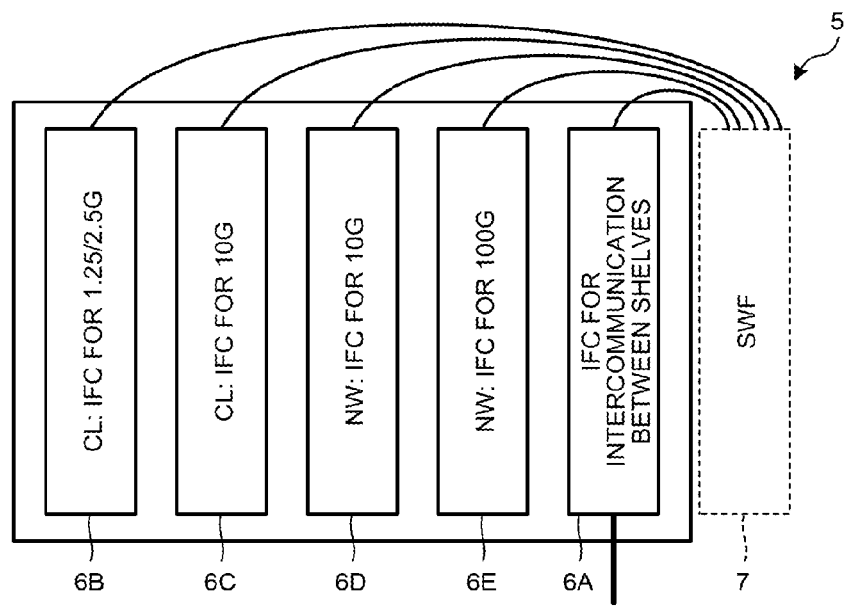
FIG. 5B is an explanation diagram illustrating an example of an accommodation image of IFCs in shelf.

FIG. 5B is an explanation diagram illustrating an example of an image of accommodating the IFCs 6 in the shelf 5. The shelf 5 illustrated in FIG. 5B has IFC 6B in which the CL-side communication cards 22A of 1.25G/2.5G are stored and IFC 6C in which the CL-side communication cards 22B of 10G are stored. Furthermore, the shelf 5 has IFC 6D in which the NW-side communication card 21B of 10G is stored, IFC 6E in which the NW-side communication card 21A of 100G is stored, and the IFC 6A for intercommunication between shelves.

The IFC 6B can store the CL-side communication cards 22A of 1.25G/2.5G whose number is 40 at a maximum. Herein, the number of slots used by the IFC 6B is two. The IFC 6C can store the CL-side communication cards 22B of 10G whose number is ten at a maximum. Herein, the number of slots used by the IFC 6C is two. The IFC 6D can store the NW-side communication cards 21B of 10G whose number is five at a maximum. Herein, the number of slots used by the IFC 6D is two. The IFC 6E can store the NW-side communication card 21A of 100G whose number is one at a maximum. Herein, the number of slots used by the IFC 6E is four. The number of slots used by the IFC 6A for intercommunication between shelves is two. In this case, the shelf 5 can accommodate the IFCs 6 for 24 slots at a maximum.

Multi-shelf accommodation design requires to decrease the number of shelves at a minimum by satisfying constrained conditions of the number N of shelves, a combination Nn of the number N of shelves and communication cards n, the number of maximum slots that can be accommodate in the shelf 5, the number of slots used by the IFCs 6, and securing of communication between groups.

Figure 6:
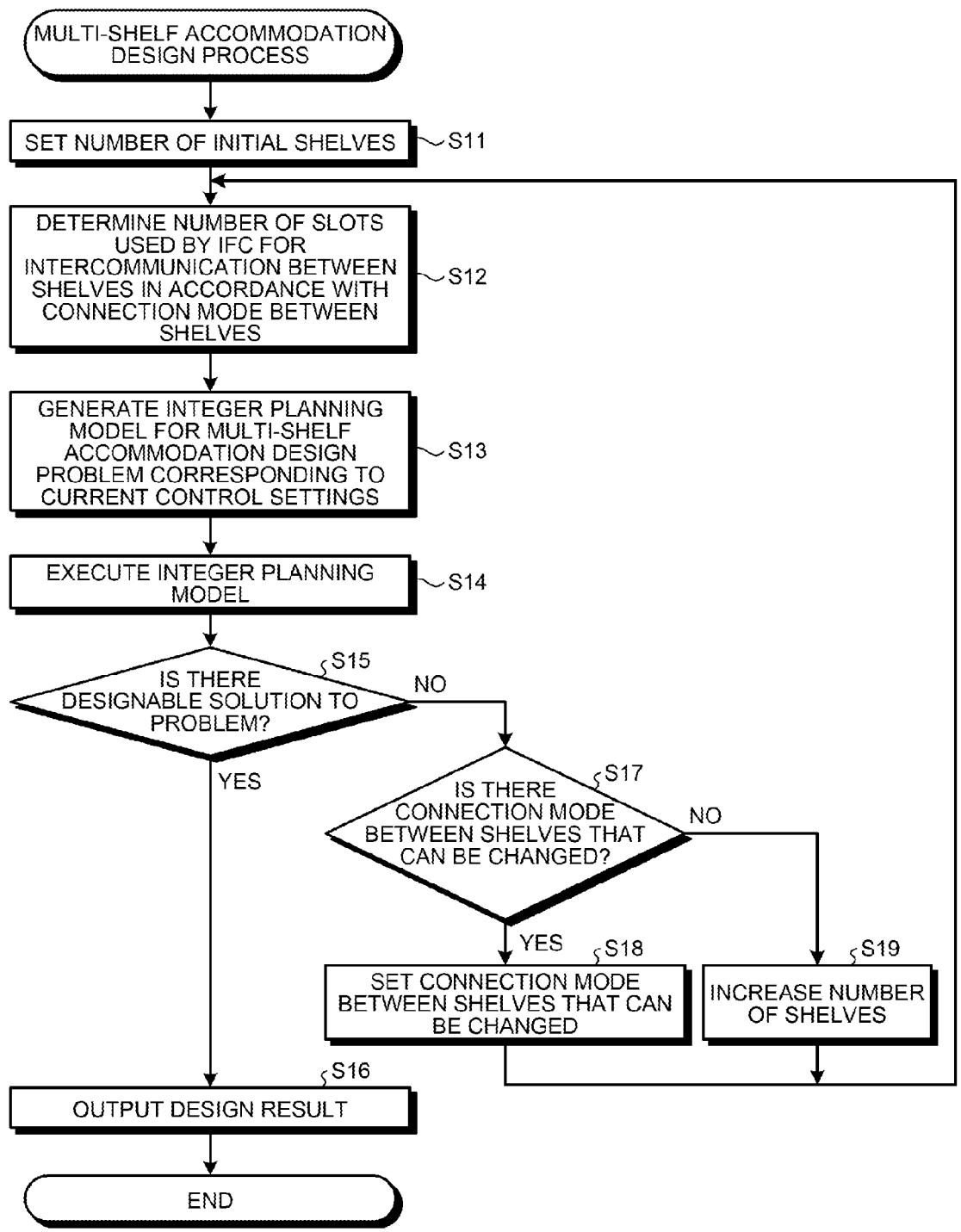
FIG. 6 is a flowchart illustrating an example of processing operations of CPU that are associated with a multi-shelf accommodation design process.

First, after it is confirmed whether all the IFCs 6 that include the NW-side communication cards 21 and the CL-side communication cards 22 for design can be accommodated in the one shelf 5, the accommodation design device 1 performs a multi-shelf accommodation design process when these IFCs cannot be completely accommodated in the one shelf 5. FIG. 6 is a flowchart illustrating an example of processing operations of the CPU 16 that are associated with the multi-shelf accommodation design process. The multi-shelf accommodation design process illustrated in FIG. 6 is a process for outputting a design result in which all the IFCs 6 that include the NW-side communication cards 21 and the CL-side communication cards 22 for design can be efficiently accommodated in the minimum number of the shelves 5.

The CPU 16 sets the initial number of shelves (Step S11). Herein, when all the IFCs 6 cannot be completely accommodated in the one shelf 5, the process is activated. Therefore, the initial number of shelves is "2", for example. The CPU 16 determines the number of slots used by the IFC 6A for intercommunication between shelves in accordance with a connection mode between the shelves 5 (Step S12).

The CPU 16 determines the number of slots of the IFC 6A for intercommunication between shelves, and then generates an integer planning model for a multi-shelf accommodation design problem corresponding to the current control settings (Step S13). The CPU 16 solves the problem by executing the generated integer planning model (Step S14).

The CPU 16 determines whether there is a designable solution to the problem (Step S15). When there is the designable solution (Step S15: YES), the CPU 16 outputs the design result to the output device 12 (Step S16), and terminates the processing operations illustrated in FIG. 6. On the other hand, when there is not the designable solution to the problem (Step S15: NO), the CPU 16 determines whether there is a connection mode between the shelves 5 that can be changed (Step S17). Herein, the connection mode of the shelves 5 is, for example, "series connection" or "ring connection" illustrated in FIGS. 7A and 7B to be described later.

When there is the connection mode between the shelves 5 that can be changed (Step S17: YES), the CPU 16 sets the connection mode that can be changed (Step S18). Then, the CPU 16 moves the process to Step S12 to determine the number of slots used by the IFC 6A for intercommunication between shelves in accordance with the set connection mode. As a result, the connection mode between the shelves 5 is reflected and thus a new integer planning model is generated.

When there is not the connection mode between the shelves 5 that can be changed (Step S17: NO), the CPU 16 increases the number of shelves (Step S19), and moves the process to Step S12 to determine the number of slots used by the IFC 6A for intercommunication between shelves. As a result, the number of shelves is increased and thus a new integer planning model is generated.

The CPU 16 used for the multi-shelf accommodation design process illustrated in FIG. 6 generates an integer planning model according to the current control settings and performs the generated integer planning model. When there is a designable solution by the integer planning model, the CPU 16 outputs a design result corresponding to the designable solution.

When there is not the designable solution to the integer planning model and there is the connection mode between the shelves 5 that can be changed, the CPU 16 sets a connection mode that can be changed and generates a new integer planning model. As a result, a new integer planning model can be generated.

When there is not the designable solution to the integer planning model and there is not the connection mode between the shelves 5 that can be changed, the CPU 16 increases the number of shelves and generates a new integer planning model. As a result, a new integer planning model can be generated.

The initial number of shelves at Step S11 is generally set to "2" and the increase of the number of shelves is performed by using one shelf as a basis, for example. However, when the reduction of an occupied area on a floor of a rack mounting thereon the shelf 5 is important, the number of the increasing shelves can be flexibly set. For example, when a rack can mount thereon shelves whose number is three at a maximum, an increase of the number of racks is larger than that of the number of shelves. Therefore, in this case, the initial number of shelves is set to "3". Then, when the accommodation by the three shelves fails, the number of shelves may be set to "6" by further adding three shelves.

Figure 7A:
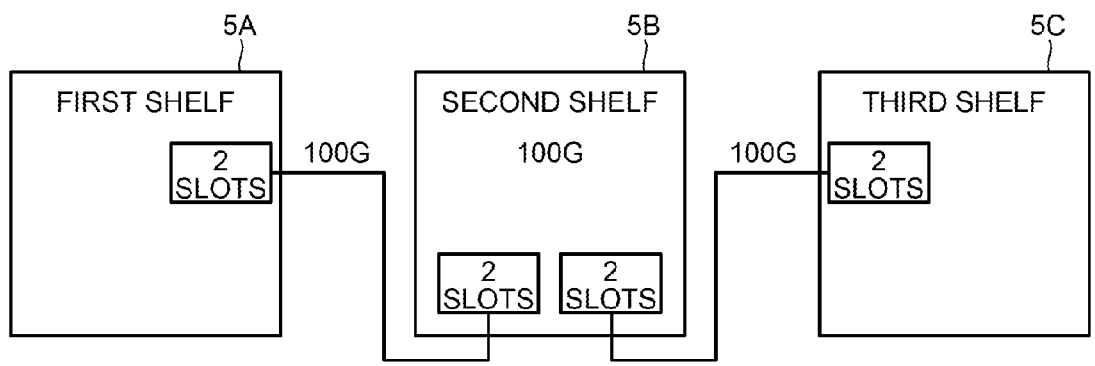
FIG. 7A is an explanation diagram illustrating an example of a connection mode (series connection) between shelves.
Figure 7B:
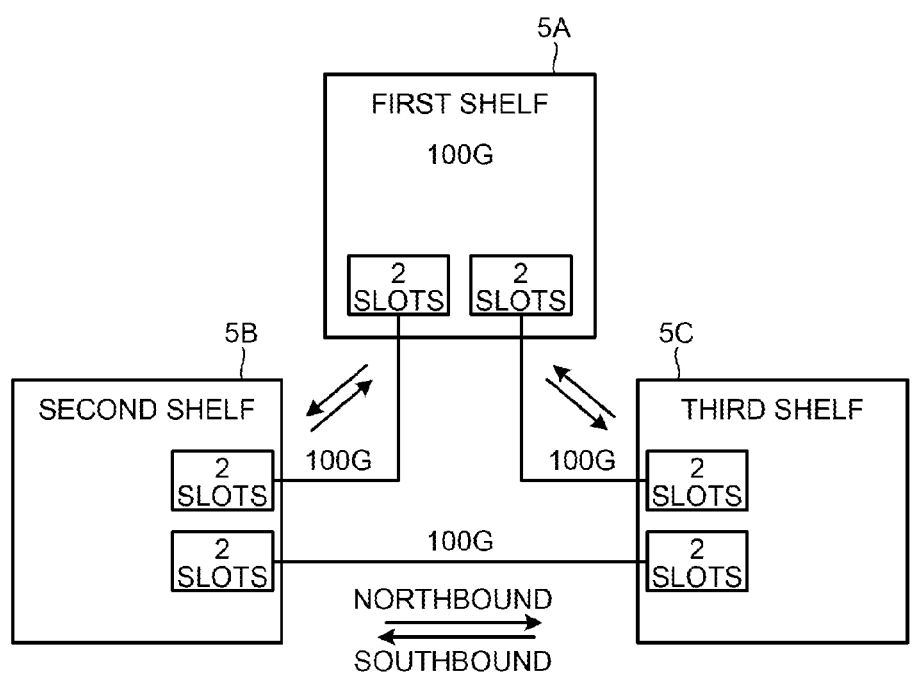
FIG. 7B is an explanation diagram illustrating an example of a connection mode (ring connection) between shelves.

FIG. 7A is an explanation diagram illustrating an example (series connection) of a connection mode between the shelves 5. FIG. 7B is an explanation diagram illustrating an example (ring connection) of a connection mode between the shelves 5. It is considered that connection modes between the shelves 5 have various modes. Because various connection modes can be considered by connection bands and connection topology, "series connection" and "ring connection" are illustrated for convenience of explanation. The embodiment is not limited to the connection modes illustrated. The "series connection" illustrated in FIG. 7A is a configuration that the plurality of shelves 5 are serially connected. In this case, the number of slots used by the IFC 6A for intercommunication between shelves of the shelves 5A and 5C at both ends is two and the number of slots used by the IFC 6A for intercommunication between shelves of the intermediate shelf 5B is four. Therefore, the number of slots, used by the IFC 6A for intercommunication between shelves, of the shelves 5A and 5C at both ends can be reduced in comparison with the intermediate shelf 5B. The "ring connection" illustrated in FIG. 7B is a configuration that the plurality of shelves 5A, 5B, and 5C are connected in the shape of ring. Because the number of slots, used by the IFC 6A for intercommunication between shelves, of all the shelves 5A, 5B, and 5C is four, these shelves have the same slots.

Next, the integer planning model for the multi-shelf accommodation design problem will be explained. An objective function of the integer planning model minimizes the sum of the number of slots of the IFCs 6 that accommodate the NW-side communication cards 21 and the CL-side communication cards 22 in the two or more shelves 5. As a result, the number of shelves in the node 4 is minimized.

The integer planning model has first to fourth variables. The first variable is a Boolean identifier that indicates whether the optical path 3 is used in the shelf 5. The second variable is the number (natural number) of the IFCs 6 that can be used in each of the shelves 5. The third variable is a Boolean identifier that indicates whether a combination of the optical paths 3 is separated into and accommodated in the shelves 5. The fourth variable is a Boolean identifier that indicates southbound connection or northbound connection when the connection mode between the shelves 5 is "ring connection". Herein, for example, "southbound" is clockwise and "northbound" is counter clockwise.

The integer planning model has first to fourth constrained conditions. The first constrained condition is a condition that the NW-side communication cards 21 corresponding to each of the optical paths 3 are certainly accommodated in any one of the shelves 5. The second constrained condition is a condition that indicates the maximum number of slots, as an example of shelf information, which can be stored in the IFC 6 inside each of the shelves 5. The third constrained condition is a condition that indicates the maximum storage number of communication cards of the IFCs 6, as an example of card information. The fourth constrained condition is a condition that indicates the maximum communication capacity between the shelves 5, as an example of a communication limit capacity. Moreover, the fourth constrained condition is a condition for managing which of the shelves 5 mounts thereon each of the NW-side communication cards 21 corresponding to the two optical paths 3 to be transferred, as an example of a correspondence relationship. Moreover, the integer planning model can be specifically expressed by mathematical expressions. FIGS. 8A and 8B are explanation diagrams illustrating an example of variables and constrained conditions of the integer planning model.

"h" illustrated in FIGS. 8A and 8B indicate the NW-side optical path 3. "H100" indicates a set of optical paths "h" of the band 100G. "H10" indicates a set of optical paths "h" of the band 10G. "s" indicates the shelf 5 that has the SWF 7. "OP(h, s)" is an identifier that indicates whether the optical path "h" is used in the shelf 5. Herein, when the optical path "h" is used in the shelf 5, the identifier is "1". When the optical path "h" is not used in the shelf 5, the identifier is "0".

"NW_10G_IFC(s)" indicates the number of the IFCs 6D that store the NW-side communication cards 21B of 10G in the shelf 5. "CL_10G_IFC(s)" indicates the number of the IFCs 6C that store the CL-side communication cards 22B of 10G in the shelf 5. "CL_1_2.5G_IFC(s)" indicates the number of the IFCs 6B that store the CL-side communication cards 22A of 1.25G/2.5G in the shelf 5.

"transferFlag(s1, s2, h1, h2)" is an identifier that indicates whether the optical paths h1 and h2 are separated into and accommodated in the shelves s1 and s2, for example. Herein, when the paths are separated into and accommodated in s1 and s2, the identifier is "0". When the paths are not separated into and accommodated in s1 and s2, the identifier is "1".

"NorthRoundFlag(s1, s2, h1, h2)" is an identifier that indicates from which of rotation directions intercommunication between shelves is performed when the optical paths h1 and h2 are separated into and accommodated in the shelves s1 and s2. In case of "ring connection", the optical path h1 is accommodated in the shelf s1 and the optical path h2 is accommodated in the shelf s2. Herein, it is determined that a communication path from the shelf s2 to the shelf s1 is north-round of s2->s1. When it is north-round, the identifier is "0". When it is not north-round (it is south-round), the identifier is "1". "SouthRoundFlag(s1, s2, h1, h2)" is an identifier that indicates from which of rotation directions intercommunication between shelves is performed when the optical paths h1 and h2 are separated into and accommodated in the shelves s1 and s2. Herein, in case of "ring connection", the optical path h1 is accommodated in the shelf s1 and the optical path h2 is accommodated in the shelf s2. It is determined that a communication path from the shelf s1 the shelf s2 is south-round of s1->s2. The identifier is "0" when it is south-round. The identifier is "1" when it is not south-round (it is north-round).

"Slot_100G_NW_IFC" indicates the number of slots of the IFC 6E that store the NW-side communication cards 21A of 100G. In this case, the number of slots is "4", for example. "Slot_10G_NW_IFC" indicates the number of slots of the IFC 6D that store the NW-side communication cards 21B of 10G. In this case, the number of slots is "2", for example. "Slot_10G_CL_IFC" indicates the number of slots of the IFC 6C that store the CL-side communication cards 22B of 10G. In this case, the number of slots is "2", for example.

"Slot_1_2.5G_CL_IFC" indicates the number of slots of the IFC 6B that store the CL-side communication cards 22A of 1G and 2.5G other than 10G. In this case, the number of slots is "2", for example.

"ShelfSlotCap" indicates the maximum number of slots that can be used per the one shelf 5. In this case, the number is "24", for example. "RsvdSlotForIC(s)" indicates the number of slots of IFC that are used for intercommunication between shelves per the one shelf 5. "OP_BW(h)" indicates a band of the optical path h. In this case, the band is "8" for 10G and "80" for 100G.

"1_2.5GAddDndNum(h)" indicates the sum of Demand numbers of 1G and 2.5G, which are added from the current node, belonging to the optical path h100 or h10. "10GAddDndNum(h)" indicates the sum of Demand numbers of 10G, which is added from the current node 4, belong to the optical path h100 or h10.

"Limit_10G_NW_IFC" indicates the maximum storage number of the NW-side communication cards 21B of 10G that can be stored in the IFC 6D for the NW-side communication card 21B of 10G. In this case, the number is "5", for example. "Limit_1_2.5G_CL_IFC" indicates the maximum storage number of the CL-side communication cards 22A of 1.25G and 2.5G other than 10G that can be stored in the IFC 6B for the CL-side communication card 22A of 1.25G and 2.5G other than 10G. In this case, the number is "40", for example. "Limit_10G_CL_IFC" indicates the maximum storage number of the NW-side communication cards 21B of 10G that can be stored in the IFC 6C for the CL-side communication card 22B of 10G. In this case, the number is "10", for example.

"transferBW(h1, h2)" indicates Demand capacity by which transfer between the optical paths h1 and h2 is performed. "ConnectBWLimit(s1, s2)" indicates a limit value of communication capacity that is secured between the shelves s1 and s2. "NRContainSpan(ss1, ss2, s1, s2)" is an identifier that indicates whether Demand passes between the shelves ss1 and ss2 when transmitting Demand from the shelf s1 to the shelf s2 in a north-bound manner. "SRContainSpan(ss1, ss2, s1, s2)" is an identifier that indicates whether Demand passes between the shelves ss1 and ss2 when transmitting Demand from the shelf s1 to the shelf s2 in a south-bound manner.

An objective function for the integer planning model sets "a sum of the number of slots used by IFC", which is a parameter directly leading to the reduction of the number of shelves, to the minimum value. The objective function can be expressed by Equation (1).

$$\sum_{h \in H100} \{Slot\_100G\_NW\_IFC * OP(h, s) + \qquad (1)$$

$$Slot\_10G\_NW\_IFC * NW\_10G\_IFC(s) +$$

$$Slot\_10G\_CL\_IFC * CL\_10G\_IFC(s) +$$

$$Slot\_1\_2.5\_CL\_IFC * CL\_1\_2.5G\_IFC(s)\}$$

In the integer planning model, the first variable is an identifier that indicates whether the optical path 3 is used in the shelf 5. The first variable is expressed by "OP(h, s)". Moreover, the second variable indicates the number (natural number) of the IFCs 6 with various types that can be used in the shelves 5. The second variable is expressed by, for example, "NW_10G_IFC(s)", "CL_10G_IFC(s)", and "CL_1_2.5G_IFC(s)". Moreover, the NW-side communication cards 21A of 100G are directly accommodated in the shelf 5 in the device according to the present embodiment, and thus the number of slots is defined by "Slot_100G_NW_IFC" and the number is defined by "OP(h, s)".

The third variable is a Boolean identifier that indicates whether a combination of the optical paths 3 is separated into and accommodated in the shelf 5. The third variable is expressed by, for example, "transferFlag(s1, s2, h1, h2)". The fourth variable is a Boolean identifier that indicates southbound connection or northbound connection when a connection mode between the shelves 5 is "ring connection". The fourth variable is expressed by, for example, "NorthRoundFlag(s1, s2, h1, h2)" and "SouthRoundFlag(s1, s2, h1, h2)". Herein, the fourth variable is defined for "ring connection" whose connection between the shelves 5 is ring. In case of "series connection", there is only one path. Therefore, it is assumed that "NorthRoundFlag(s1, s2, h1, h2)" is always set to "1" and "SouthRoundFlag(s1, s2, h1, h2)" is not substantially used, for example.

In the integer planning model, the first constrained condition is a condition that the NW-side communication card 21 corresponding to each of the optical paths 3 is certainly accommodated in one of the shelves 5. Therefore, the first constrained condition can be expressed by Equation (2).

$$\sum_{s} OP(h, s) = 1 \text{ (for } \forall h) \qquad (2)$$

In the integer planning model, the second constrained condition is a condition that a sum of the number of slots used by the IFCs 6 that are accommodated in the shelves 5 does not exceed the maximum number of slots that can be accommodated in the shelves 5. The second constrained condition sets the IFCs 6 that are accommodated within the number of slots obtained by subtracting the number of slots used by the IFC 6A for intercommunication between shelves from the maximum number of slots of the total shelves 5. The number of slots that can be used per the one shelf 5 can be expressed by "ShelfSlotCap (24, in this case)–RsvdSlotForIC(s)". Therefore, the second constrained condition can be expressed by Equation (3).

$$Slot\_100G\_NW\_IFC * \sum_{h \in H100} OP(h, s) + \qquad (3)$$

$$Slot\_10G\_NW\_IFC * NW\_10G\_IFC(s) +$$

$$Slot\_10G\_CL\_IFC * CL\_10G\_IFC(s) +$$

$$Slot\_1\_2.5G\_CL\_IFC * CL\_1\_2.5G\_IFC(s) \le$$

$$ShelfSlotCap - RsvdSlotForIC(s)(\text{for } \forall s)$$

In the integer planning model, the third constrained condition is a condition that indicates the maximum storage number of communication cards in the IFCs 6 with various types. For example, a constrained condition for storing the NW-side communication cards 21B of 10G in the IFC 6D can be expressed by Equation (4).

$$\sum_{h \in H10} OP(h, s) - Limit\_10G\_NW\_IFC * NW\_10G\_IFC(s) \le 0 \text{ (for } \forall s) \qquad (4)$$

A constrained condition for storing the CL-side communication cards 22A of 1.25G/2.5G in the IFC 6B can be expressed by Equation (5).

$$\sum_h 1\_2.5GAddDndNum(h) * OP(h, s) - \qquad (5)$$

$$Limit\_1\_2.5G\_CL\_IFC * CL\_1\_2.5G\_IFC(s) \leq 0 \text{ (for } \forall s)$$

A constrained condition for storing the CL-side communication cards 22B of 10G in the IFC 6C can be expressed by Equation (6).

$$\sum_h 10GAddDndNum(h) * OP(h, s) - \qquad (6)$$

$$Limit\_10G\_CL\_IFC * CL\_10G\_IFC(s) \leq 0 \text{ (for } \forall s)$$

In the integer planning model, the fourth constrained condition is a condition that indicates the maximum communication capacity between the shelves 5 with various types. For example, the fourth constrained condition is a condition that is given not to exceed a capacity prepared by transfer capacity (communication capacity) between shelves in NW. The constrained condition can be expressed by Equation (7).

$$\sum_{h1,h2 \in s1, s2 \in S} \{transferBW(h1, h2) * \qquad (7)$$

$$(NRContainSpan(ss1, ss2, s1, s2) * NorthRoundFlag$$

$$(s1, s2) + SRContainSpan(ss1, ss2, s1, s2) *$$

$$SouthRoundFlag(s1, s2))\} \leq$$

$$ConnectionBWLimit(s1, s2))$$

(adjacent-two-shelves-with-connection-relation-for $\forall ss1, ss2 \in shelf$)

For example, the fourth constrained condition is a condition for managing which of the shelves 5 mounts thereon the NW-side communication cards 21 corresponding to the two optical paths 3 to be transferred. Moreover, when the NW-side communication cards 21 corresponding to the two optical paths 3 are stored in the different shelves 5, the fourth constrained condition is set to appropriately reflect this state on variables. The constrained condition can be expressed by Equations (8) and (9).

$$OP(s1, h1) + OP(s2, h1) - transferFlag(s1, s2, h1, h2) \leq \qquad (8)$$
$$1 (\text{for } \forall s1, s2 \in s, \forall h1, h2 \in h)$$

$$OP(s2, h1) + OP(s1, h2) - tansferFlag(s1, s2, h1, h2) \leq \qquad (9)$$
$$1 (\text{for } \forall s1, s2 \in s, \forall h1, h2 \in h)$$

For example, the fourth constrained condition is a condition that confirms whether intercommunication between the shelves 5 is northbound or not southbound in case of "ring connection". The constrained condition can be expressed by Equations (10).

$$NorthRoundFlag(s1, s2) + SouthRoundFlag(s1, s2) =$$
$$transferFlag(s1, s2, h1, h2) \qquad (10)$$

Next, operations of the accommodation design device 1 associated with multi-shelf accommodation design will be explained. First, the CPU 16 of the accommodation design device 1 acquires design premise information of the node 4 in the optical network 2, which is a design target, from the database 17. The design premise information has CL-side communication card (22) information corresponding to Demands that are added and dropped in the node 4 to be designed and NW-side communication card (21) information that treats an optical signal transmitted from the node 4 to be designed in the optical network 2. The design premise information further has path information for transmitting each Demand from the CL-side communication card 22 to the NW-side communication card 21 and information of Demand that is transferred between the optical paths 3.

Figure 9:
FIG. 9 is an explanation diagram illustrating an example of a first table.

The CPU 16 generates a first table 30 for Demand numbers corresponding to the optical paths 3 and stores the first table 30 in the database 17, on the basis of the CL-side communication card (22) information, the NW-side communication card (21) information, and the path information in design premise information. FIG. 9 is an explanation diagram illustrating an example of the first table 30. The first table 30 associates with one another an optical path number 31, a signal band 32, a type 33 of the CL-side communication card 22, and an Inter optical path 34. The optical path number 31 is a number for recognizing the optical path 3. The signal band 32 is a band that is used in the optical path 3. In the node 4 to be designed, the optical path number 31 has 1 to 15, for example, as illustrated in FIG. 9. The accommodation design device 1 uses the 15 optical paths 3. Moreover, the accommodation design device 1 recognizes the 15 NW-side communication cards 21. Furthermore, when the signal bands 32 are 10G and 100G, the accommodation design device 1 recognizes the eight optical paths 3 for 10G and the seven optical paths 3 for 100G.

The type 33 of the CL-side communication card 22 indicates the number of Demands that are added and dropped in the optical path 3 for each of three kinds of the CL-side communication cards 22 of 1.25G, 2.5G, and 10G. When the optical path number 31 is "1", the accommodation design device 1 recognizes one Demand of 1.25G, one Demand of 2.5G, and zero Demand of 10G.

The Inter optical path 34 indicates the number of Demands that are transferred from the current optical path 3 to the different optical path 3. Herein, because only signal band is important to the transfer between the optical paths 3, a band corresponds to a value that is converted by the number of 1.25G.

The accommodation design device 1 generates a second table 40 for the number (communication capacity) of transfer Demands corresponding to the optical path 3 on the basis of the design premise information. FIG. 10 is an explanation diagram illustrating an example of the second table 40. The second table 40 illustrated in FIG. 10 is illustrated by a matrix of the optical path numbers. Herein, numeric values are written at parts at which transfer occurs. A numeric value is the number of Demands that are converted by the number of 1.25G. For example, a numeric value "2" is written at a part crossed by the optical path numbers "1" and "4". This means that two Demands are transferred by the conversion of 1.25G from the optical path 3 of the optical path number "1" to the optical path 3 of the optical path number "4". Moreover, for example, "–" is written at a part crossed by the optical path numbers "2" and "5". This means that there is not Demand for transfer from the optical path 3 of the optical path number "2" to the optical path 3 of the optical path number "5".

Then, the CPU 16 of the accommodation design device 1 sets the initial number of shelves to "2" with reference to the first table 30 and the second table 40. Then, the CPU 16 assumes the connection mode between the shelves 5 as "series connection" and generates an integer planning model.

Figure 11A:
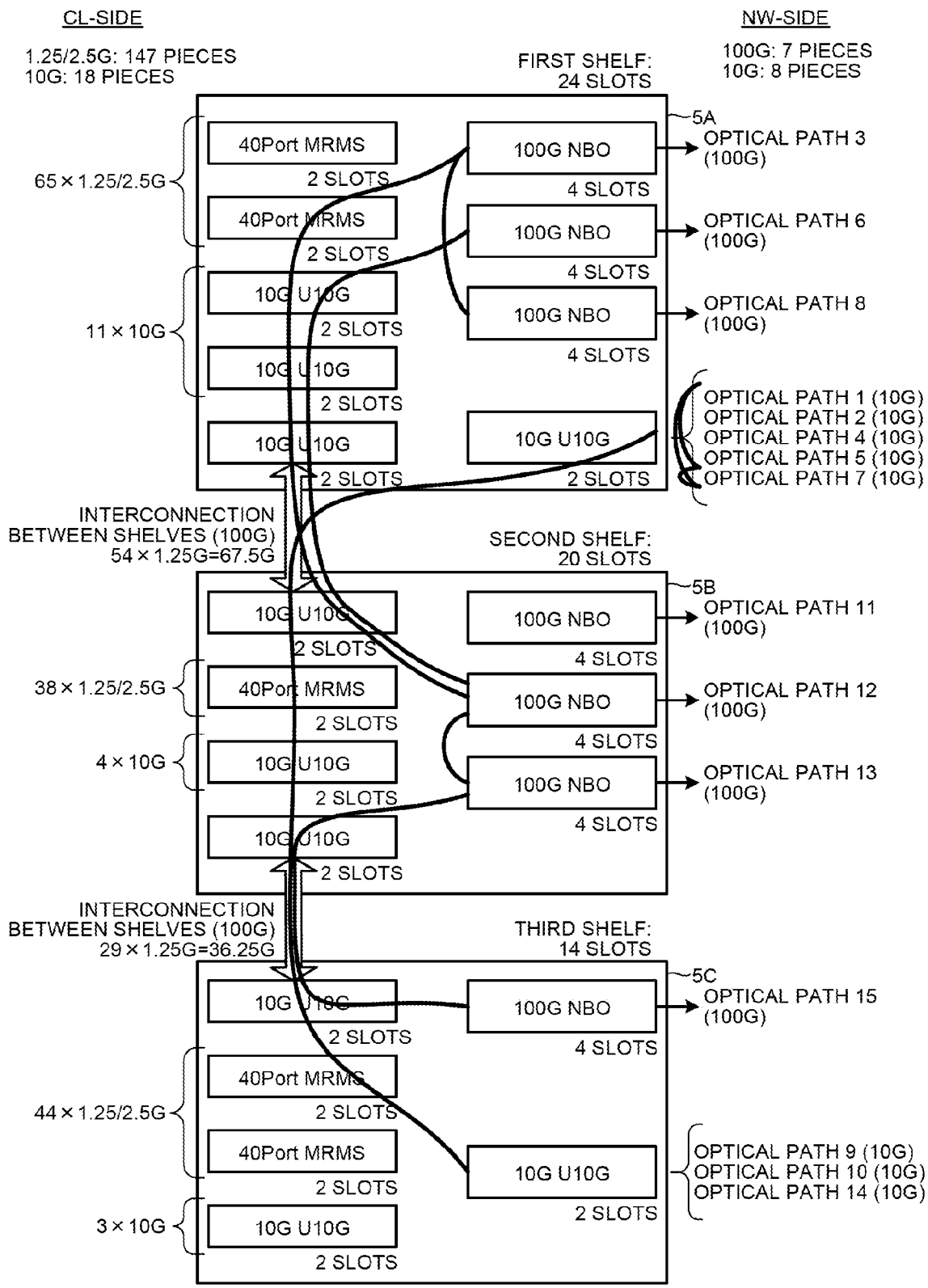
FIG. 11A is an explanation diagram illustrating an example of a design result of a comparative example (greedy method)
Figure 11B:
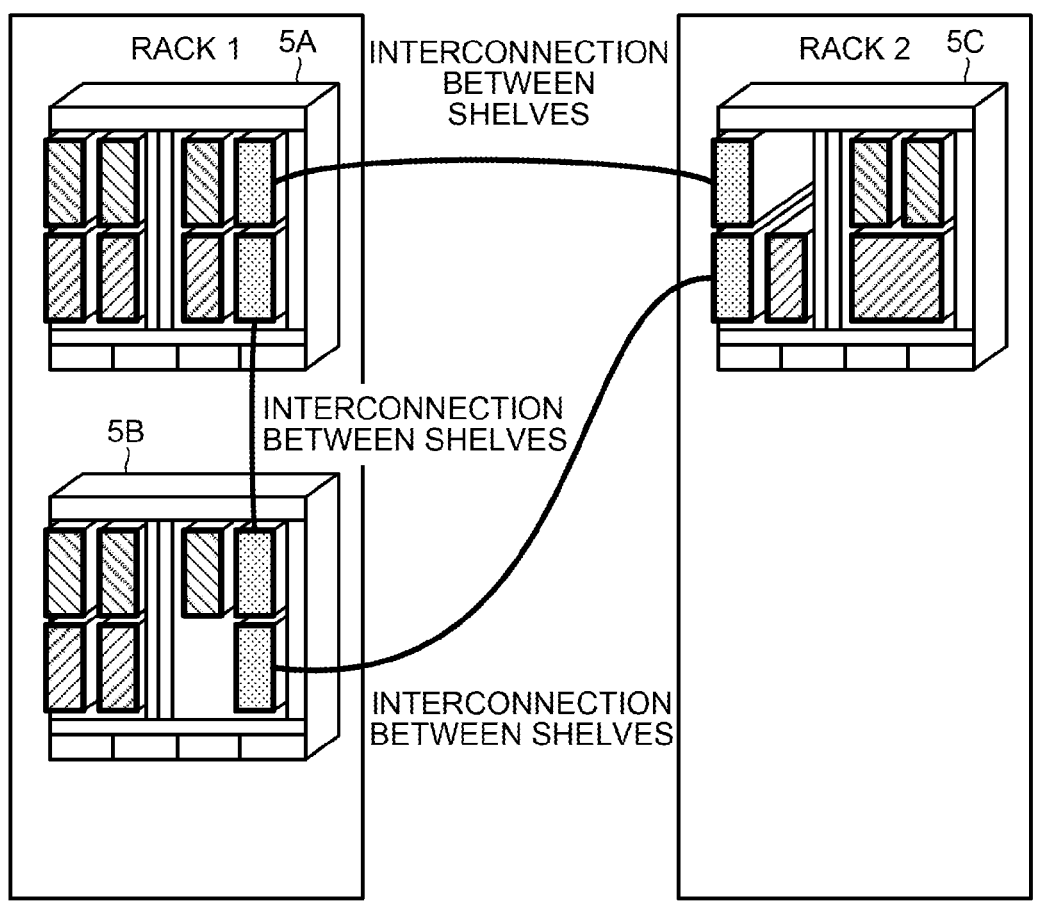
FIG. 11B is an explanation diagram illustrating an example of placing racks based on the design result of the comparative example (greedy method)

The CPU 16 performs the generated integer planning model. FIG. 11A is an explanation diagram illustrating an example of a design result according to a comparative example (greedy method). FIG. 11B is an explanation diagram illustrating an example of placing racks based on the design result according to the comparative example (greedy method).

For example, it is assumed that the CL-side communication cards 22 to be designed include the 147 CL-side communication cards 22A of 1.25G/2.5G and the 18 CL-side communication cards 22B of 10G. It is assumed that the NW-side communication cards 21 to be designed include the seven NW-side communication cards 21A of 100G and the eight NW-side communication cards 21B of 10G. It is assumed that the maximum number of slots in the shelf 5 is 24.

When the greedy method is used for the design target, the obtained design result requires the three shelves 5. Moreover, "40PortMRMS" is, for example, the IFC 6B that stores the CL-side communication cards 22A of 1.25G/2.5G. "10GU10G" is, for example, the IFC 6C that stores the CL-side communication cards 22B of 10G, the IFC 6D that stores the NW-side communication cards 21B of 10G, and the IFC 6A for intercommunication between shelves. "100GNBO" is the IFC 6E that stores the NW-side communication cards 21A of 100G.

The first shelf 5A accommodates two 40PortMRMS, four 10GU10G, and three 100GNBO. The number of slots used by each of 40PortMRMS is two, the number of slots used by each of 10GU10G is two, and the number of slots used by each of 100GNBO is four.

Two 40PortMRMS store the 65 CL-side communication cards 22A of 1.25G/2.5G, and two 10GU10G store the 11 CL-side communication cards 22B of 10G. Moreover, one 10GU10G is used for intercommunication between shelves with the second shelf 5B. In this case, 1.25G*54=67.5G in communication capacity 100G is used for intercommunication between shelves. Furthermore, three 100GNBO store the NW-side communication cards 21A of 100G of the three optical paths (for example, "3", "6", and "8"). One 10GU10G stores the NW-side communication cards 21B of 10G of the five optical paths (for example, "1", "2", "4", "5", and "7"). The first shelf 5A is totally assigned with 24 slots.

The second shelf 5B has one 40PortMRMS, three 10GU10G, and three 100GNBO. One 40PortMRMS stores the 38 CL-side communication cards 22A of 1.25G/2.5G, and one 10GU10G stores the four CL-side communication cards 22B of 10G. One 10GU10G is used for intercommunication between shelves with the first shelf 5A. Furthermore, one 10GU10G is used for intercommunication between shelves with the third shelf 5C. In this case, 1.25G*29=36.25G in communication capacity 100G is used for intercommunication between shelves. Furthermore, three 100GNBO store the NW-side communication cards 21A of 100G of the three optical paths (for example, "11", "12", and "13"). The second shelf 5B is totally assigned with 20 slots.

The third shelf 5C has two 40PortMRMS, three 10GU10G, and one 100GNBO. Two 40PortMRMS store the 44 CL-side communication cards 22A of 1.25G/2.5G, and one 10GU10G stores the three CL-side communication cards 22B of 10G. One 10GU10G is used for intercommunication between shelves with the second shelf 5B. Furthermore, one 100GNBO stores the NW-side communication card 21A of 100G of the one optical path (for example, "15"). Furthermore, one 10GU10G stores the NW-side communication cards 21B of 10G of the three optical paths (for example, "9", "10", and "14"). The third shelf 5C is totally assigned with 14 slots.

Therefore, because the three shelves 5 is required when the greedy method is used, two racks are required in which one rack can mount thereon two shelves. As a result, it is preferable that an occupied area for two racks is ensured.

In the greedy method, constrained conditions such as the number of slots used by the IFC 6 can be considered but minimization of the number of shelves cannot be ensured. Therefore, actual design requires balancing of "design satisfying constrained conditions", which cannot be realized in a conventional greedy method, and "design whose cost can be further suppressed".

Figure 12A:
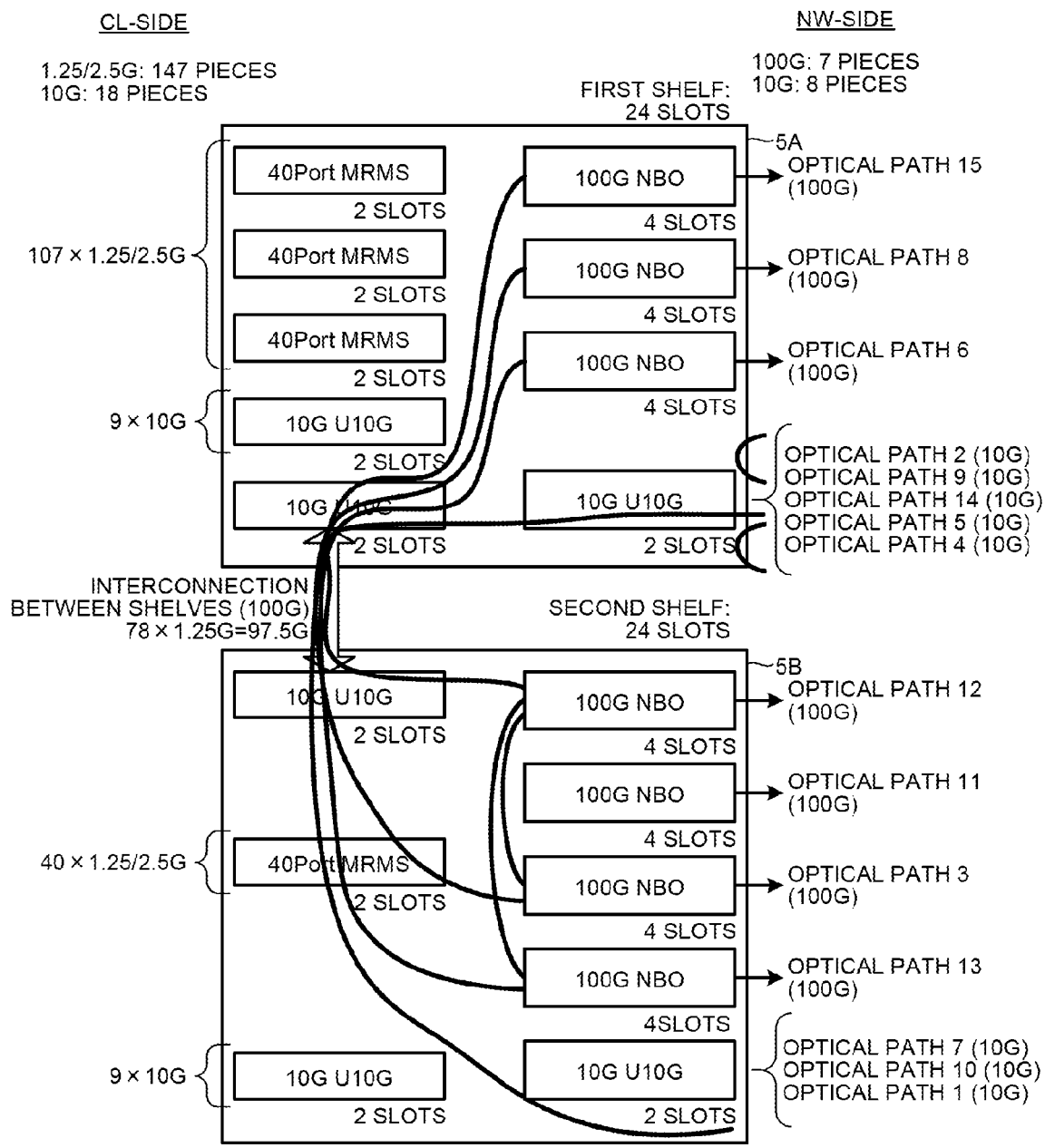
FIG. 12A is an explanation diagram illustrating an example of a design result according to the present embodiment.
Figure 12B:
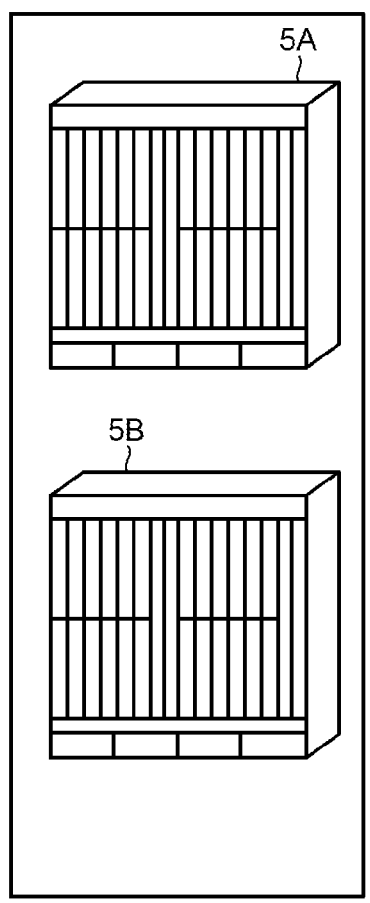
FIG. 12B is an explanation diagram illustrating an example of placing racks based on the design result according to the present embodiment.

Therefore, when the accommodation design device 1 according to the present embodiment is employed, it is possible to obtain a design result for multi-shelf accommodation design as described later. FIG. 12A is an explanation diagram illustrating an example of a design result according to the present embodiment. FIG. 12B is an explanation diagram illustrating an example of placing racks based on the design result according to the present embodiment. Herein, design targets are the same as those of FIG. 11A. As a result, design targets can be accommodated in the two shelves 5.

The first shelf 5A accommodates three 40PortMRMS, three 10GU10G, and three 100GNBO. Three 40PortMRMS store the 107 CL-side communication cards 22A of 1.25G/2.5G, and one 10GU10G stores the nine CL-side communication cards 22B of 10G. One 10GU10G is used for intercommunication between shelves with the second shelf 5B. In this case, 1.25G*78=97.5G in communication capacity 100G is used for intercommunication between shelves. Furthermore, three 100GNBO store the NW-side communication cards 21A of 100G of the three optical paths (for example, "15", "8", and "6"). One 10GU10G stores the NW-side communication cards 21B of 10G of the five optical paths (for example, "2", "9", "14", "5", and "4"). The first shelf 5A is totally assigned with 24 slots.

The second shelf 5B accommodates one 40PortMRMS, three 10GU10G, and four 100GNBO. One 40PortMRMS stores the 40 CL-side communication cards 22A of 1.25G/2.5G, and one 10GU10G stores the nine CL-side communication cards 22B of 10G. One 10GU10G is used for intercommunication between shelves with the first shelf 5A. Furthermore, four 100GNBO store the NW-side communication cards 21A of 100G of the four optical paths (for example, "12", "11", "3", and "13"). One 10GU10G stores the NW-side communication cards 21B of 10G of the three optical paths (for example, "7", "10", and "1"). The second shelf 5B is totally assigned with 24 slots.

In the design, the connection mode between the first shelf 5A and the second shelf 5B indicates that accommodation design satisfying all the constrained conditions is realized in the "series connection" state. This design indicates that two-shelf design is realized by using 97.5G in capacity of 100G for intercommunication between shelves.

Therefore, when the present embodiment is employed, because the CL-side communication cards 22 and the NW-side communication cards 21 to be designed can be accommodated in the two shelves 5, only one rack is required, which mounts thereon two shelves. As a result, the number of shelves can be reduced by 33% in comparison with the greedy method, and the number of racks can be reduced by 50% in comparison with the greedy method. As a result, because a floor area occupied by racks is reduced by 50% in comparison with the greedy method, a facility cost can be greatly reduced.

The CPU 16 according to this embodiment collects count information that indicates the number of the NW-side communication cards 21 and the CL-side communication cards 22 to be designed, when the IFCs 6 with various types that store the NW-side communication cards 21 and the CL-side communication cards 22 to be designed are accommodated in the two or more shelves 5. Furthermore, the CPU 16 collects card information that indicates the number of slots used by each of the IFCs 6. Furthermore, the CPU 16 collects shelf information, which indicates the maximum number of slots that can be accommodated by the IFCs 6 in the shelf 5, and first correspondence information, which indicates a correspondence relationship when the different NW-side communication cards communicate with each other between the shelves 5. Furthermore, the CPU 16 collects communication limit capacity that can be used for intercommunication between the shelves 5. The CPU 16 generates an integer planning model for assigning the IFCs 6, which store the NW-side communication cards 21 and the CL-side communication cards 22 to be designed, into the minimum number of the shelves 5 on the basis of the card information, the count information, the shelf information, the first correspondence information, and the communication limit capacity. The CPU 16 executes the integer planning model, and thus outputs, when there is a design solution of accommodation design for assigning the IFCs 6 into the minimum number of the shelves 5, the design solution to the output device 12. As a result, the accommodation design device 1 can provide multi-shelf accommodation design in which the number of the shelves 5 can be suppressed to the minimum value of two or more.

The CPU 16 according to this embodiment sets the number of usable shelves before generating an integer planning model, and changes a connection mode between shelves when there is not a design solution obtained by executing the integer planning model. Furthermore, the CPU 16 collects card information, count information, shelf information, correspondence information, and communication limit capacity in accordance with the changed connection mode between shelves. Furthermore, the CPU 16 again generates an integer planning model on the basis of the card information, the count information, the shelf information, the correspondence information, and the communication limit capacity. As a result, a new integer planning model obtained by reflecting the change of a connection mode between shelves can be again generated.

The CPU 16 according to this embodiment sets to increase the number of shelves when there is not a design solution obtained by executing an integer planning model and there is not a connection mode between shelves that can be changed. After setting to increase the number of shelves, the CPU 16 collects card information, count information, shelf information, correspondence information, and communication limit capacity. Furthermore, the CPU 16 again generates an integer planning model on the basis of the card information, the count information, the shelf information, the correspondence information, and the communication limit capacity. As a result, a new integer planning model obtained by reflecting the change of the number of shelves can be again generated.

Each component of each device illustrated in the drawings is a functional concept. Therefore, these components are not necessarily constituted physically as illustrated in the drawings. In other words, the specific configuration of dispersion/integration of each device is not limited to the illustrated configuration. Therefore, all or a part of each device can be dispersed or integrated functionally or physically in an optional unit in accordance with various types of loads or operating conditions.

All or a part of the process functions performed by each device may be realized by a CPU (Central Processing Unit) (or microcomputer such as MPU (Micro Processing Unit) and MCU (Micro Controller Unit)). Moreover, all or a part of the process functions may be realized by a program that is analyzed and executed by the CPU (or microcomputer such as MPU or MCU), or may be realized by a hardware by wired logic.

According to an aspect of an embodiment, the number of shelves can be further decreased.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein an accommodation design program that causes a computer to execute a process comprising:

collecting, with a processor, optical network information from a data base, when storage cards with plural types that store first communication cards and second communication cards are accommodated in two or more shelves of a node, the collected optical network information including count information indicating a number of the first communication cards and the second communication cards, card information indicating a number of slots used by the storage cards, shelf information indicating a maximum number of slots to be accommodated by the storage cards in a shelf, correspondence information indicating a correspondence relationship when between-shelf-intercommunication between the different first communication cards is performed, and communication limit capacity capable of being used for the intercommunication between the shelves;

generating, with the processor, an integer planning model for assigning the first communication cards and the second communication cards within the two or more shelves on the basis of the card information, the count information, the shelf information, the correspondence information, and the communication limit capacity; and executing, with the processor, the integer planning model which identifies a minimum number of the two or more shelves to house the assigned first communication cards and the second communication cards and an arrangement of the first communication cards and the second communication cards within the minimum number of the two or more shelves, and displaying, when there is a design solution for accommodation design for assigning the storage cards into the minimum shelves, the design solution that identifies the minimum number of the two or more shelves and the arrangement of the first communication cards and the second communication cards within the minimum number of the two or more shelves.

2. The non-transitory computer-readable recording medium according to claim 1, wherein the process further comprises:

setting a number of usable shelves before generating the integer planning model, changing a connection mode between the shelves when there is not a design solution obtained by executing the integer planning model, and collecting the card information, the count information, the shelf information, the correspondence information, and the communication limit capacity in accordance with the changed connection mode between the shelves; and again generating the integer planning model on the basis of the card information, the count information, the shelf information, the correspondence information, and the communication limit capacity.

3. The non-transitory computer-readable recording medium according to claim 2, wherein the process further comprises:

setting to increase the number of shelves when there is not the design solution obtained by executing the integer planning model and there is not the connection mode between the shelves to be changed;

collecting the card information, the count information, the shelf information, the correspondence information, and the communication limit capacity after setting to increase the number of shelves; and again generating the integer planning model on the basis of the card information, the count information, the shelf information, the correspondence information, and the communication limit capacity.

4. The non-transitory computer-readable recording medium according to claim 2, wherein the connection mode between the shelves is series connection or ring connection of the shelves.

5. The non-transitory computer-readable recording medium according to claim 2, wherein the connection mode between the shelves is series connection of the shelves.

6. The non-transitory computer-readable recording medium according to claim 2, wherein the connection mode between the shelves is ring connection of the shelves.

7. An accommodation design device comprising:
a memory; and
a processor coupled to the memory,
wherein the processor executes a process comprising:
collecting, with the processor, optical network information from a data base, when storage cards with plural types that store first communication cards and second communication cards are accommodated in two or more shelves of a node, the collected optical network information including count information indicating a number of the first communication cards and the second communication cards, card information indicating a number of slots used by the storage cards, shelf information indicating a maximum number of slots to be accommodated by the storage cards in a shelf, correspondence information indicating a correspondence relationship when between-shelf-intercommunication between the different first communication cards is performed, and communication limit capacity capable of being used for the intercommunication between the shelves;

generating, with the processor, an integer planning model for assigning the first communication cards and the second communication cards within the two or more shelves, on the basis of the card information, the count information, the shelf information, the correspondence information, and the communication limit capacity; and executing, with the processor, the integer planning model which identifies a minimum number of the two or more shelves to house the assigned first communication cards and the second communication cards and an arrangement of the first communication cards and the second communication cards within the minimum number of the two or more shelves, and displaying, when there is a design solution for accommodation design for assigning the storage cards into the minimum shelves, the design solution that identifies the minimum number of the two or more shelves and the arrangement of the first communication cards and the second communication cards within the minimum number of the two or more shelves.

8. An accommodation design method of an accommodation design device, the accommodation design method comprising:

collecting, with a processor, optical network information from a data base, when storage cards with plural types that store first communication cards and second communication cards are accommodated in two or more shelves of a node, the collected optical network information including count information indicating a number of the first communication cards and the second communication cards, card information indicating a number of slots used by the storage cards, shelf information indicating a maximum number of slots to be accommodated by the storage cards in a shelf, correspondence information indicating a correspondence relationship when between-shelf-intercommunication between the different first communication cards is performed, and communication limit capacity capable of being used for the intercommunication between the shelves, using the processor of the accommodation design device;

generating, with the processor, an integer planning model for assigning the first communication cards and the second communication cards within the two or more shelves, on the basis of the card information, the count information, the shelf information, the correspondence information, and the communication limit capacity, using the processor; and executing, with the processor, the integer planning model which identifies a minimum number of the two or more shelves to house the assigned first communication cards and the second communication cards and an arrangement of the first communication cards and the second communication cards within the minimum number of the two or more shelves, and displaying, when there is a design solution for accommodation design for assigning the storage cards into the minimum shelves, the design solution that identifies the minimum number of the two or more shelves and the arrangement of the first communication cards and the second communication cards within the minimum number of the two or more shelves, using the processor.

* * * * *